(12) United States Patent
Tseng et al.

(10) Patent No.: US 9,171,983 B2
(45) Date of Patent: Oct. 27, 2015

(54) HEAT DISSIPATION STRUCTURE

(75) Inventors: Huang-Chi Tseng, Hsin-Chu (TW);
Chiuan-Ting Li, Hsin-Chu (TW);
Wei-Jieh Lee, Hsin-Chu (TW);
Chun-Ming Yang, Hsin-Chu (TW);
Kuan-Wen Tung, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 585 days.

(21) Appl. No.: 13/543,984

(22) Filed: Jul. 9, 2012

(65) Prior Publication Data
US 2013/0240016 A1    Sep. 19, 2013

(30) Foreign Application Priority Data
Mar. 13, 2012  (CN) .......................... 2012 1 0066800

(51) Int. Cl.
*H01L 31/042* (2014.01)
*H01L 31/052* (2014.01)
*H02S 40/42* (2014.01)
*F28F 3/02* (2006.01)

(52) U.S. Cl.
CPC ................ *H01L 31/052* (2013.01); *F28F 3/02* (2013.01); *H02S 40/425* (2014.12); *Y02E 10/50* (2013.01)

(58) Field of Classification Search
CPC ..................... H01L 31/052; F28F 3/02–3/027; H02S 40/425
USPC .................................................. 136/246, 259
See application file for complete search history.

(56) References Cited

U.S. PATENT DOCUMENTS

| | | | |
|---|---|---|---|
| 6,026,890 A | | 2/2000 | Akaji et al. |
| 6,085,830 A | * | 7/2000 | Mashiko et al. ............. 165/80.3 |
| 7,600,558 B2 | | 10/2009 | Chen |
| 2006/0137733 A1 | * | 6/2006 | Schripsema et al. .......... 136/246 |
| 2008/0062651 A1 | * | 3/2008 | Reis et al. ...................... 361/710 |
| 2008/0135086 A1 | * | 6/2008 | Corrales ........................ 136/246 |
| 2008/0151505 A1 | | 6/2008 | Chen et al. |
| 2009/0223555 A1 | * | 9/2009 | Ammar ......................... 136/246 |
| 2010/0078061 A1 | * | 4/2010 | Lu et al. ........................ 136/246 |

FOREIGN PATENT DOCUMENTS

| | | |
|---|---|---|
| CN | 1162106 | 10/1997 |
| CN | 2930230 | 8/2007 |
| CN | 101207997 | 6/2008 |
| TW | M252903 | 12/2004 |
| TW | M415258 | 11/2011 |
| WO | WO 2010118183 A2 * | 10/2010 |

* cited by examiner

*Primary Examiner* — Allison Bourke
(74) *Attorney, Agent, or Firm* — Justin King; WPAT, PC

(57) ABSTRACT

A heat dissipation structure is provided and includes a plurality of heat conduction bases and at least one flexible fin. Each of the heat conduction bases includes a first surface and a second surface. A positioning groove is formed in the first surface of each of the heat conduction bases, and the second surface of each of the heat conduction bases is assembled to a backlight surface of a solar module. The fin is coupled to the positioning grooves and connected between the heat conduction bases.

11 Claims, 8 Drawing Sheets

US 9,171,983 B2

HEAT DISSIPATION STRUCTURE

RELATED APPLICATIONS

This application claims priority to China Application Serial Number 201210066800.4, filed Mar. 13, 2012, which is herein incorporated by reference.

BACKGROUND

1. Technical Field

The present disclosure relates to a heat dissipation structure, and more particularly to a heat dissipation structure of a solar module.

2. Description of Related Art

Solar modules can convert light energy, particularly sunlight, into electrical energy without producing any greenhouse gases during the conversion process. Therefore, solar modules are an environmentally friendly way to generate electrical energy. Recently, along with the progress and development in photovoltaic technology, the cost of solar modules has gone down considerably while the conversion efficiency of solar modules has increased. As a result, solar modules are being widely used, particularly in the consumer market. For example, solar modules can now be found on the rooftops of homes and on buildings, as well as in various electronic products.

However, the efficiency of a solar module is reduced when the temperature increases. In general, the power output of a solar module will reduce by 1 W when the temperature increases by 1° C. Moreover, when the working temperature of a solar module is too high, the efficiency thereof will be very poor, and also, the material lifespan and product reliability of the solar module will be reduced.

A conventional solar module having a heat dissipation device often includes a plurality of solar cells and metal fins in contact with the solar cells. However, the thermal contraction ratio of the solar cells in such a conventional solar module is different from the thermal contraction ratio of the fins. When the temperature is changed, since the fins are directly adhered to the back surface of the solar module, the fins may undergo extreme deformation (i.e., thermal expansion and contraction) which may damage the solar cells. Furthermore, when the solar module is located outdoors, the solar module may be easily bent when subjected to strong winds, such that the fins may lose some of their adhesivity to the back surface of the solar module. In serious situations, the fins may be completely removed from the back surface of the solar module. Hence, the lifespan and efficiency of the solar module may be significantly reduced.

SUMMARY

An aspect of the present invention is to provide a heat dissipation structure.

In an embodiment of the present invention, a heat dissipation structure includes a plurality of heat conduction bases and at least one flexible fin. Each of the heat conduction bases includes a first surface and a second surface. A positioning groove is formed in the first surface of each of the heat conduction bases, and the second surface of each of the heat conduction bases is assembled to a backlight surface of a solar module. The fin is coupled to the positioning grooves and connected between the heat conduction bases.

In the aforementioned embodiments of the present invention, since the second surfaces of the heat conduction bases are assembled to the backlight surface of the solar module and the fin is coupled to the positioning grooves and connected between the heat conduction bases, the fin does not contact the solar module. Moreover, the fin is a flexible element, such that the path along which the fin is extended can be adjusted in accordance with practical requirements.

In addition, each of the heat conduction bases can be located on one of a plurality of solar cells of the solar module. When the temperature of the solar cells is increased, the heat transfers to the heat conduction bases first. Thereafter, the heat transfers to the fin from the heat conduction bases. As a result, even though the thermal contraction ratio of the solar cells is different from the thermal contraction ratio of the fin, the solar cells are not damaged by the fin when the fin undergoes thermal expansion and contraction. When the solar module is located outdoors, even if the solar module is bent when subjected to a large air flow (e.g., a strong wind), each of the heat conduction bases is located on one of the solar cells and the fin is coupled to the positioning grooves of the heat conduction bases. Through such a configuration, the fin is prevented from separating from the solar module in the event that the solar module undergoes deformation.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
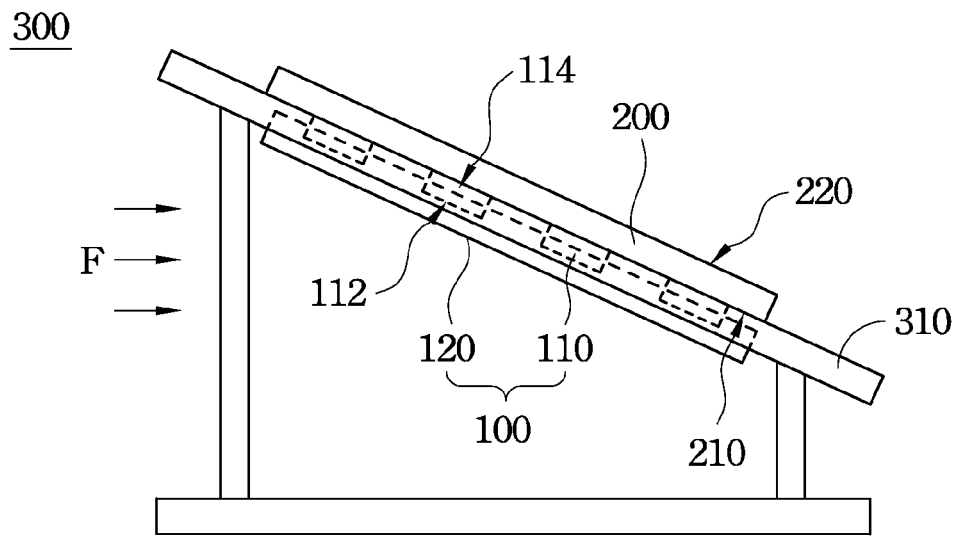
FIG. 1 is a schematic side view of a solar electrical apparatus, illustrating a heat dissipation structure of an embodiment of the present invention applied to the solar electrical apparatus.

FIG. 1 is a schematic side view of a solar electrical apparatus 300, illustrating a heat dissipation structure 100 of an embodiment of the present invention applied to the solar electrical apparatus 300. The solar electrical apparatus 300 includes the heat dissipation structure 100, a solar module 200, and a support base 310. The solar module 200 is placed on the support base 310 and includes a light facing surface 220 and a backlight surface 210. The light-facing surface 220 faces light such as sunlight, and the backlight surface 210 faces away from light. In use, light energy can be absorbed by the light-facing surface 220 of the solar module 200. The heat dissipation structure 100 is located on the backlight surface 210. When an air flow F passes the heat dissipation structure 100, heat generated by the solar module 200 can be dissipated by the heat dissipation structure 100.

Figure 2:
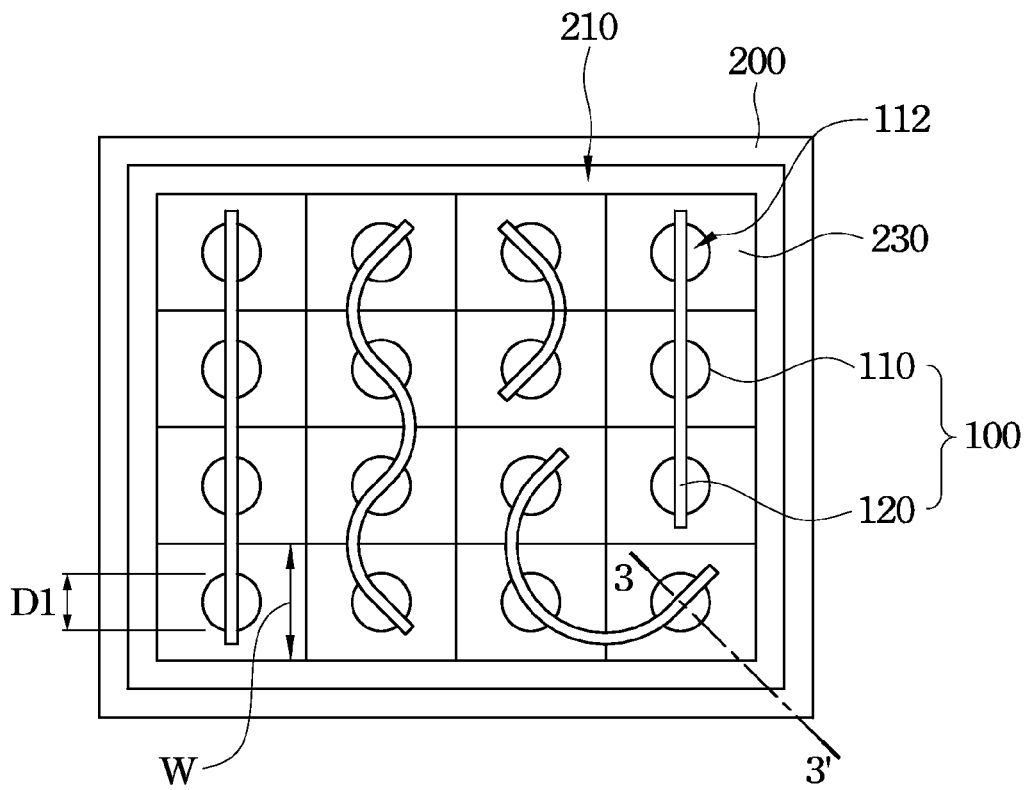
FIG. 2 is a rear view of the heat dissipation structure and a solar module shown in FIG. 1 in accordance with one embodiment of the present invention.
Figure 3:
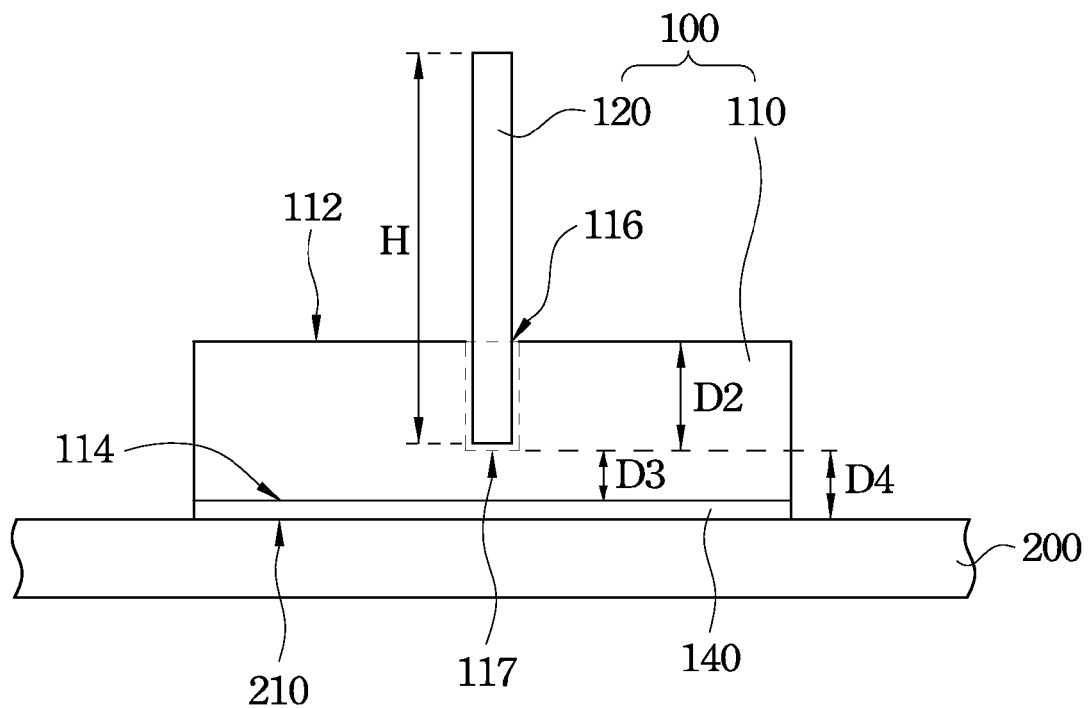
FIG. 3 is a cross sectional view of the heat dissipation structure and the solar module taken along line 3-3' shown in FIG. 2.

FIG. 2 is a rear view of the heat dissipation structure 100 and the solar module 200 shown in FIG. 1 in accordance with one embodiment of the present invention. FIG. 3 is a cross sectional view of the heat dissipation structure 100 and the solar module 200 taken along line 3-3' shown in FIG. 2. As shown in FIG. 2 and FIG. 3, the heat dissipation structure 100 includes a plurality of heat conduction bases 110 and at least one flexible fin 120. Each of the heat conduction bases 110 includes a first surface 112 and a second surface 114. A positioning groove 116 is formed in the first surface 112, and the second surface 114 is assembled to the backlight surface 210 of the solar module 200. In this embodiment, one of the fins 120 is coupled to the positioning grooves 116 and is connected between the heat conduction bases 110. Each of the fins 120 is thermally conductive and flexible. For example, the fins 120 and the heat conduction bases 110 may be made of a material that includes iron, aluminum, or a heat dissipation plastic, and the heat conduction bases 110 may be made of a material that includes one or more ceramic material.

In this embodiment, the heat dissipation structure 100 may optionally include a plurality of adhesive layers 140, each located between the second surface 114 of one of the heat conduction bases 110 and the backlight surface 210 of the solar module 200. Each of the adhesive layers 140 may be a double-sided adhesive layer, or may include a silicon or packaging material.

The solar module 200 includes a plurality of solar cells 230, and the number of the solar cells 230 is the same as the number of the heat conduction bases 110. The second surface 114 of each of the heat conduction bases 110 can be fixed to one of the solar cells 230 by one of the adhesive layers 140. Furthermore, each of the heat conduction bases 110 may be cylindrical, and the diameter D1 of each of the heat conduction bases 110 may be smaller than or equal to the width W of each of the solar cells 230.

Since the fins 120 are flexible, each of the fins 120 connected between a plurality of the heat conduction bases 110 can extend along a straight or curved path, as shown in FIG. 2, and the positioning grooves 116 can also be designed so that they are formed along a straight or curved path to facilitate coupling of the fins 120 thereto. In addition, the numbers of the solar cells 230, the heat conduction bases 110, and the fins 120, the height of the fins 120, and the shape of the heat conduction bases 110 can be changed in accordance with practical requirements, such as the direction of the air flow (i.e., the direction of the wind), and the temperature of each of the solar cells, and the present invention is not limited in this regard.

Figure 4:
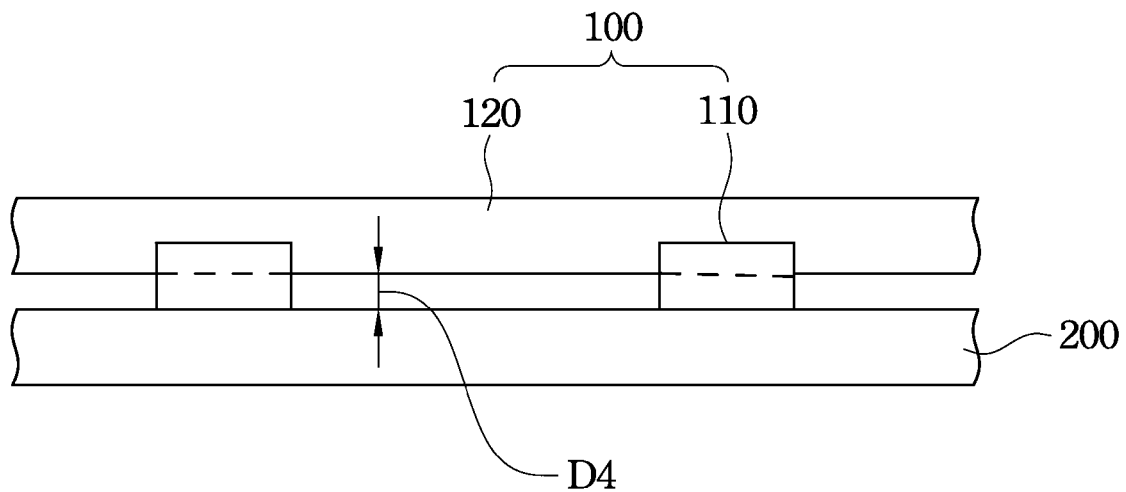
FIG. 4 is a schematic view of a fin connected between two heat conduction bases.

FIG. 4 is a schematic view of the fin 120 connected between two of the heat conduction bases 110. As shown in FIG. 3 and FIG. 4, the height H of the fin 120 is greater than the depth D2 of each of the positioning grooves 116, such that at least a portion of the fin 120 can protrude from the first surface 112 of each of the heat conduction bases 110. Moreover, each of the positioning grooves 116 includes a groove bottom 117, and a distance D3 is present between the groove bottom 117 and the second surface 114 of each of the heat conduction bases 110. A gap D4 between a portion of the fin 120 located between the heat conduction bases 110 (i.e., a bottommost portion of the fin 120) and the solar module 200 is greater than the distance D3.

In this embodiment, with reference to the entire structure of the heat dissipation structure 100 and the solar module 200, since the second surfaces 114 of the heat conduction bases 110 are assembled to the backlight surface 210 of the solar module 200 and the fins 120 are coupled to the positioning grooves 116 of the heat conduction bases 110 and connected between the heat conduction bases 110, each of the gaps D4 is formed between one of the fins 120 and the solar module 200. As a result, the fins 120 do not contact the solar module 200. Furthermore, the fins 120 are flexible, as described above, such that the path along which the fins 120 extend can be adjusted in accordance with practical requirements. For example, in a high temperature region of the solar module 200, the fins 120 can be curved to increase the surface area of the fins 120 for contacting an air flow (e.g., the wind). Moreover, the gap D4 can allow for the free flow of air, such that the fins 120 do not block the air flow.

Referring FIG. 2, each of the heat conduction bases 110 can be located on one of solar cells 230 of the solar module 200. When the temperature of the solar cells 230 is increased, the heat transfers to the heat conduction bases 110 first. Thereafter, the heat transfers to the fins 120 from the heat conduction bases 110. As a result, even though the thermal contraction ratio of the solar cells 230 is different from the thermal contraction ratio of the fins 120, the solar cells 230 are not damaged by the fins 120 when the fins 120 undergo thermal expansion and contraction. Moreover, when the solar module 200 is located outdoors, even if the solar module 200 is bent when subjected to a large air flow (e.g., a strong wind), each of the heat conduction bases 110 is located on one of the solar cells 230 and the fins 120 are coupled to the positioning grooves 116 of the heat conduction bases 110. Through such a configuration, the fins 120 are prevented from separating from the solar module 200 in the event that the solar module 200 undergoes deformation.

The solar cells 230 are not damaged easily by the heat dissipation structure 100 due to thermal expansion and contraction, and the heat dissipation structure 100 does not separate from the solar cells 230 easily when the solar module 200 is bent, such that the lifespan and efficiency of the solar module 200 are significantly increased.

It is to be noted that the connection relationship of the aforementioned elements will not be repeated in the following description, and only aspects related to the fixing methods between the fins 120 and the heat conduction bases 110 will be described.

Figure 5:
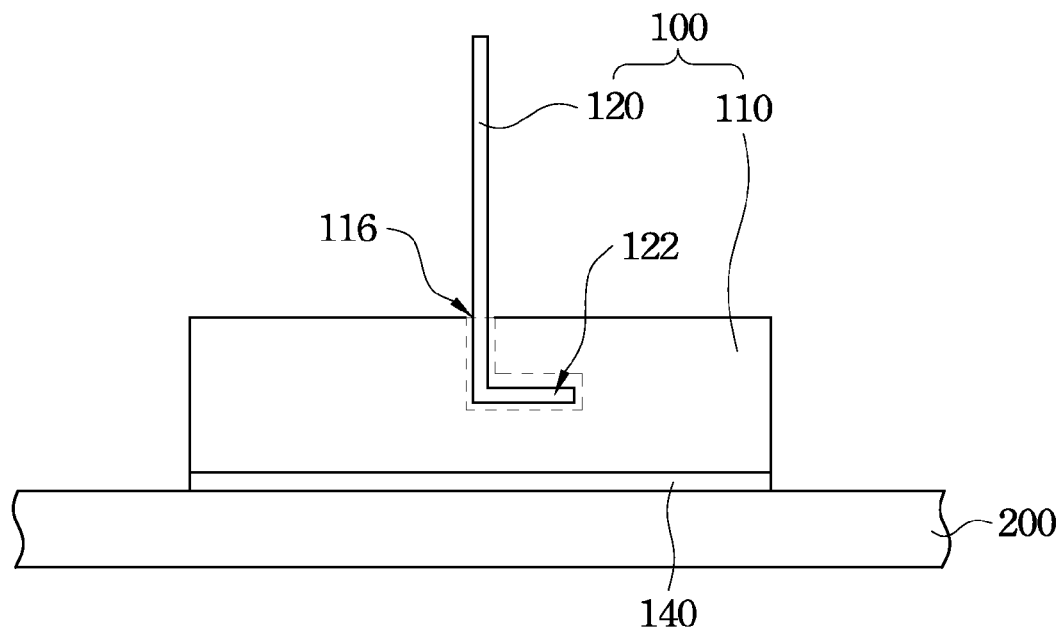
FIG. 5 is another embodiment of the heat dissipation structure shown in FIG. 3.

FIG. 5 is another embodiment of the heat dissipation structure 100 shown in FIG. 3. This embodiment will be described with reference to one of the heat conduction bases 110 and one of the flexible fins 120, as shown in FIG. 5. The heat dissipation structure 100 includes the heat conduction base 110 and the flexible fin 120. The difference between this embodiment and the aforementioned embodiments is that the fin 120 further includes a coupling portion 122. Each of the coupling portion 122 and the positioning groove 116 has an L-shaped cross section. As a result, the fin 120 can be fixed in the positioning groove 116 by the coupling portion 122. For the structure of the entire heat dissipation structure 100, such as that shown in FIG. 2, the positions of the coupling portions 122 of the fins 120 corresponds to the positions of the heat conduction bases 110 so as to allow for coupling with the positioning grooves 116 of the heat conduction bases 110.

Figure 6:
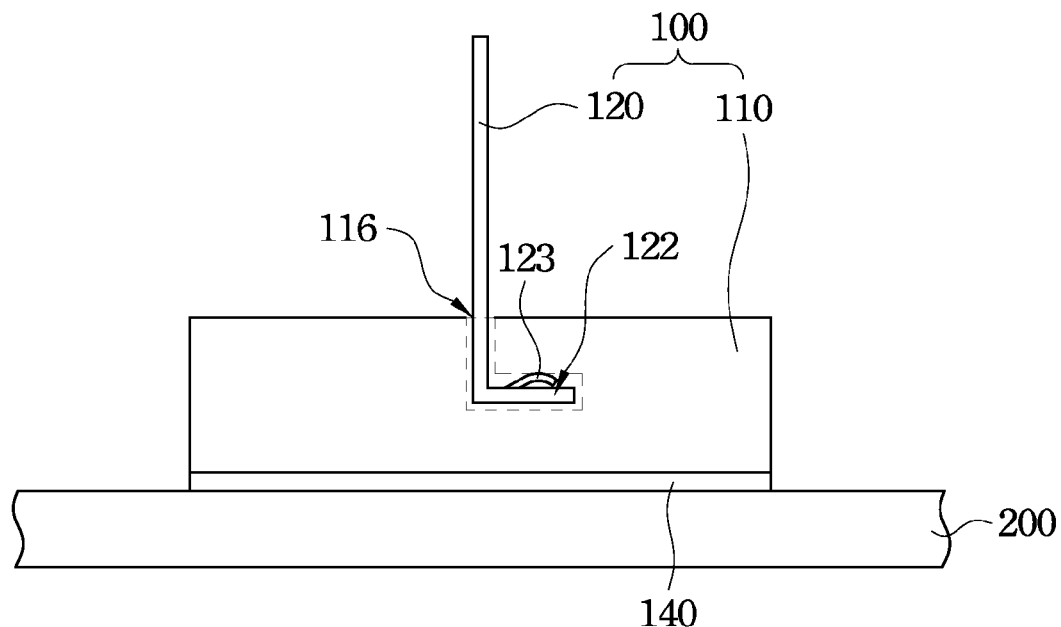
FIG. 6 is another embodiment of the heat dissipation structure shown in FIG. 5.

FIG. 6 is another embodiment of the heat dissipation structure 100 shown in FIG. 5. This embodiment will be described with reference to one of the heat conduction bases 110 and one of the flexible fins 120, as shown in FIG. 6. The heat dissipation structure 100 includes the heat conduction base 110 and the flexible fin 120. The difference between this embodiment and the aforementioned embodiments is that each of the coupling portions 122 of the fin 120 includes an elastic piece 123. The elastic piece 123 can be in contact with the positioning groove 116, such that the fin 120 can be fixed in the positioning groove 116 by the elastic piece 123 of the coupling portion 122. The number and the positions of the elastic piece(s) 123 for each of the fins 120 (see FIG. 2) can be determined in accordance with practical requirements.

Figure 7:
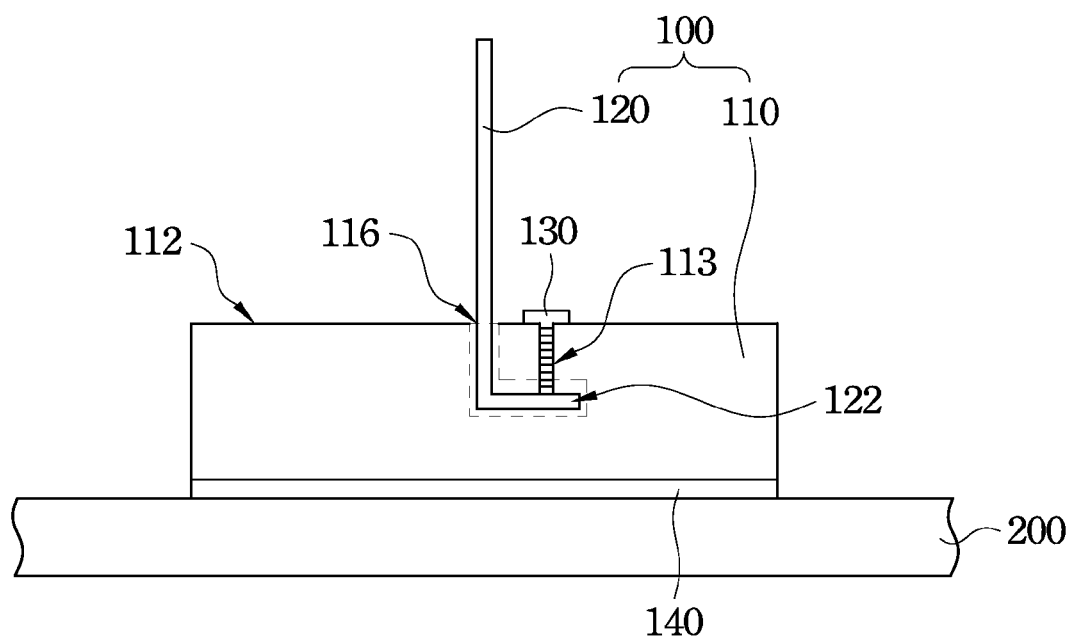
FIG. 7 is another embodiment of the heat dissipation structure shown in FIG. 5.

FIG. 7 is another embodiment of the heat dissipation structure 100 shown in FIG. 5. This embodiment will be described with reference to one of the heat conduction bases 110 and one of the flexible fins 120, as shown in FIG. 7. The heat dissipation structure 100 includes the heat conduction base 110 and the flexible fin 120. The difference between this embodiment and the aforementioned embodiments is that a through hole 113 is formed in the first surface 112 and is communicated with the positioning groove 116. The heat dissipation structure 100 further includes a fixing element 130 coupled to the through hole 113. The fixing element 130 abuts against the coupling portion 122, such that the coupling portion 122 is securely fixed in the positioning groove 116.

Figure 8:
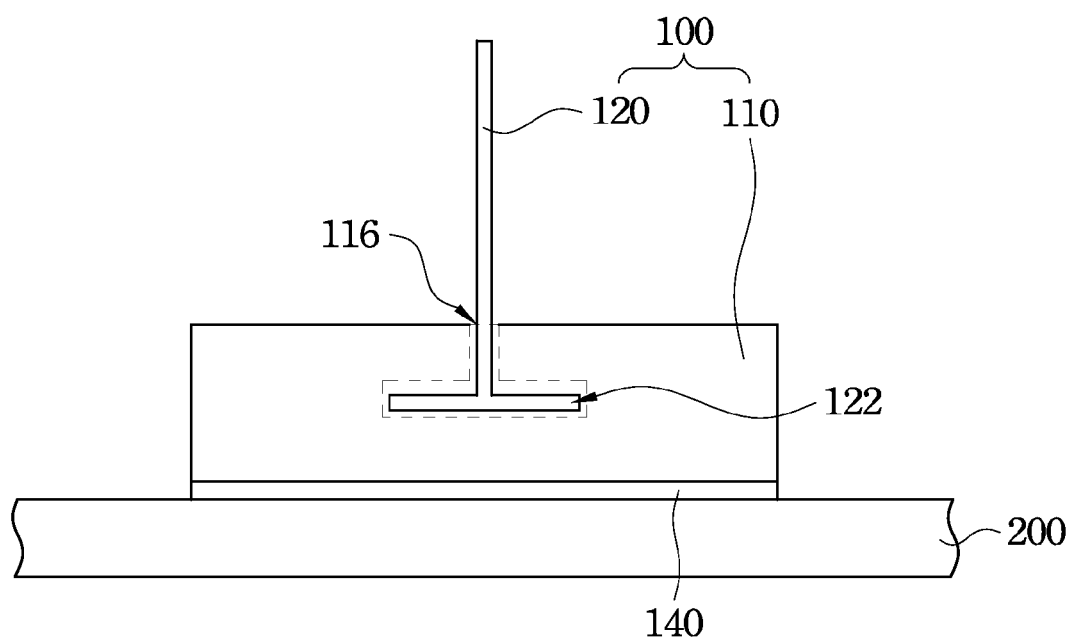
FIG. 8 is another embodiment of the heat dissipation structure shown in FIG. 3.

FIG. 8 is another embodiment of the heat dissipation structure 100 shown in FIG. 3. This embodiment will be described with reference to one of the heat conduction bases 110 and one of the flexible fins 120, as shown in FIG. 8. The difference between this embodiment and the aforementioned embodiments is that each of the coupling portion 122 and the positioning groove 116 has a T-shaped cross section. In this embodiment, the fin 120 is fixed in the positioning groove 116 by the coupling portion 122.

Figure 9:
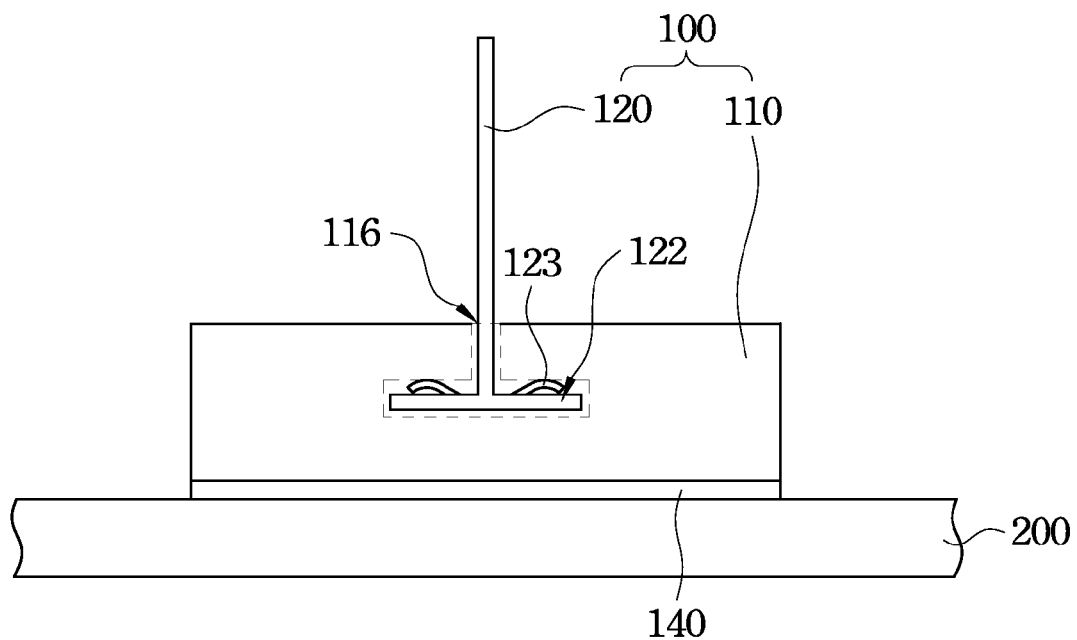
FIG. 9 is another embodiment of the heat dissipation structure shown in FIG. 8.

FIG. 9 is another embodiment of the heat dissipation structure 100 shown in FIG. 8. This embodiment will be described with reference to one of the heat conduction bases 110 and one of the flexible fins 120, as shown in FIG. 9. The difference between this embodiment and the aforementioned embodiments is that the coupling portion 122 of the fin 120 includes two elastic pieces 123. The elastic pieces 123 can be in contact with the positioning groove 116, such that the fin 120 can be fixed in the positioning groove 116 by the elastic pieces 123 of the coupling portion 122. The number and the positions of the elastic pieces 123 can be determined in accordance with practical requirements.

Figure 10:
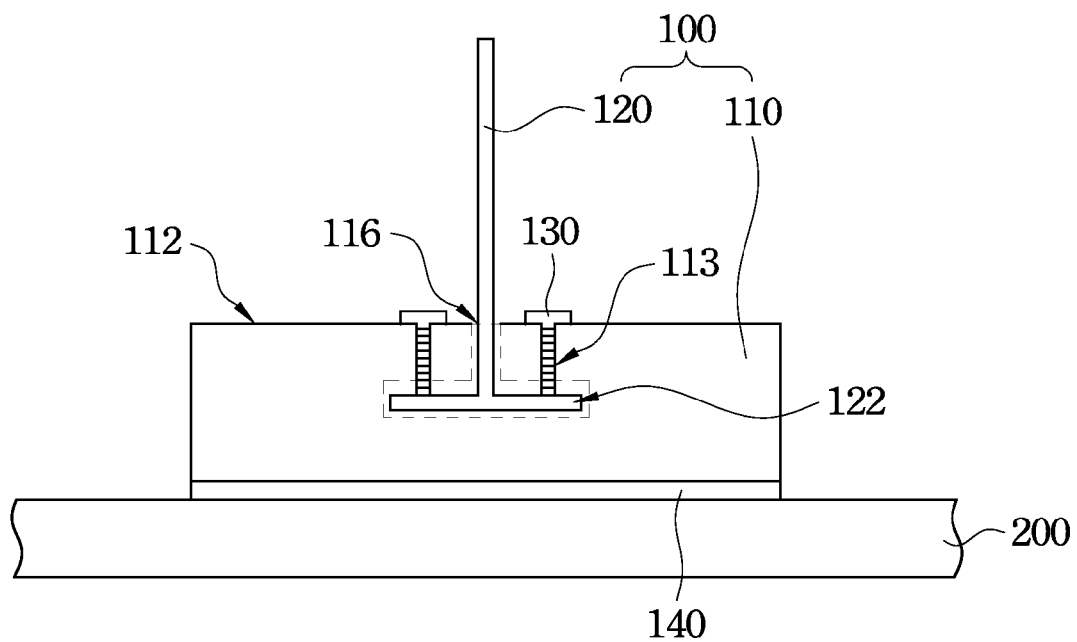
FIG. 10 is another embodiment of the heat dissipation structure shown in FIG. 8.

FIG. 10 is another embodiment of the heat dissipation structure 100 shown in FIG. 8. This embodiment will be described with reference to one of the heat conduction bases 110 and one of the flexible fins 120, as shown in FIG. 10. The difference between this embodiment and the aforementioned embodiments is that two through holes 113 are formed in the first surface 112 and communicated with the positioning groove 116. The heat dissipation structure 100 further includes two fixing elements 130 respectively coupled to the through holes 113. The two fixing elements 130 abut against the coupling portion 122, such that the coupling portion 122 is securely fixed in the positioning groove 116.

Figure 11:
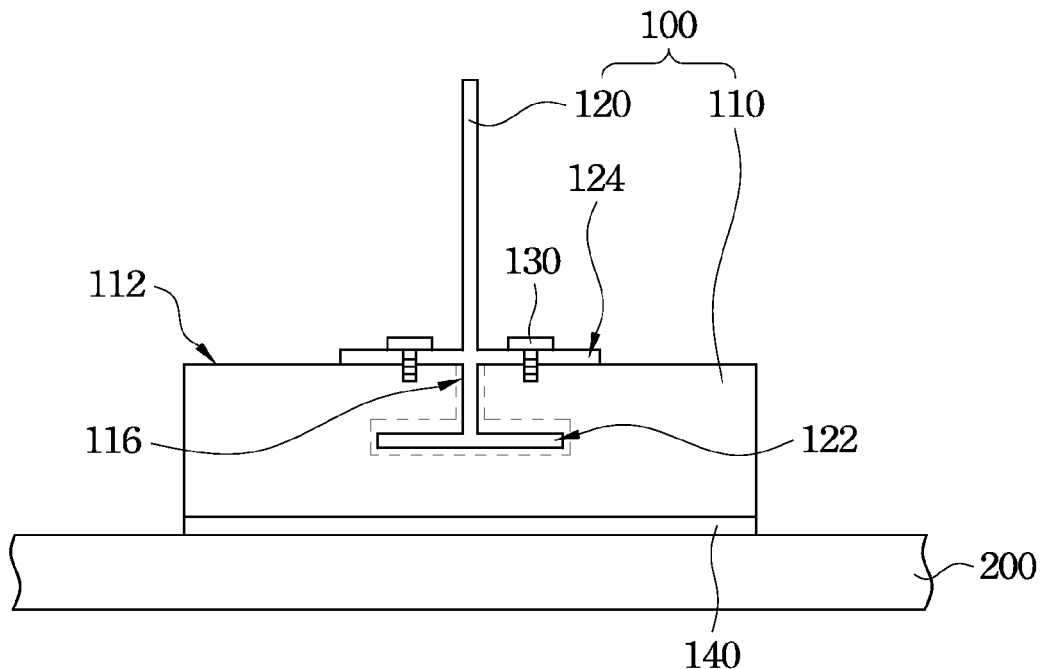
FIG. 11 is another embodiment of the heat dissipation structure shown in FIG. 8.

FIG. 11 is another embodiment of the heat dissipation structure 100 shown in FIG. 8. This embodiment will be described with reference to one of the heat conduction bases 110 and one of the flexible fins 120, as shown in FIG. 11. The difference between this embodiment and the aforementioned embodiments is that the fin 120 includes two extending wings 124 located on the heat conduction base 110. The heat dissipation structure 100 further includes two fixing elements 130 extending through the extending wings 124 and fixed to the heat conduction base 110.

Figure 12:
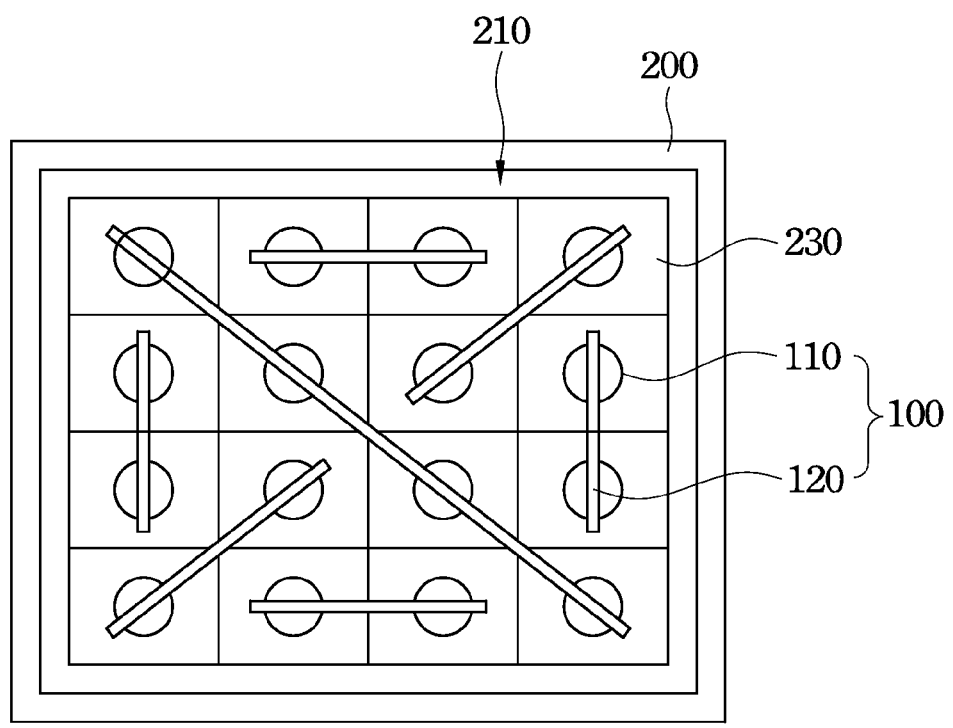
FIG. 12 is a rear view of the heat dissipation structure and the solar module shown in FIG. 1 in accordance with another embodiment of the present invention.

FIG. 12 is a rear view of the heat dissipation structure 100 and the solar module 200 shown in FIG. 1 in accordance with another embodiment of the present invention. In this embodiment, the fins 120 connected between the heat conduction bases 110 extend along straight paths. Some of the fins 120 are located on two of the heat conduction bases 110, and some of the fins 120 are located on four of the heat conduction bases 110.

Figure 13:
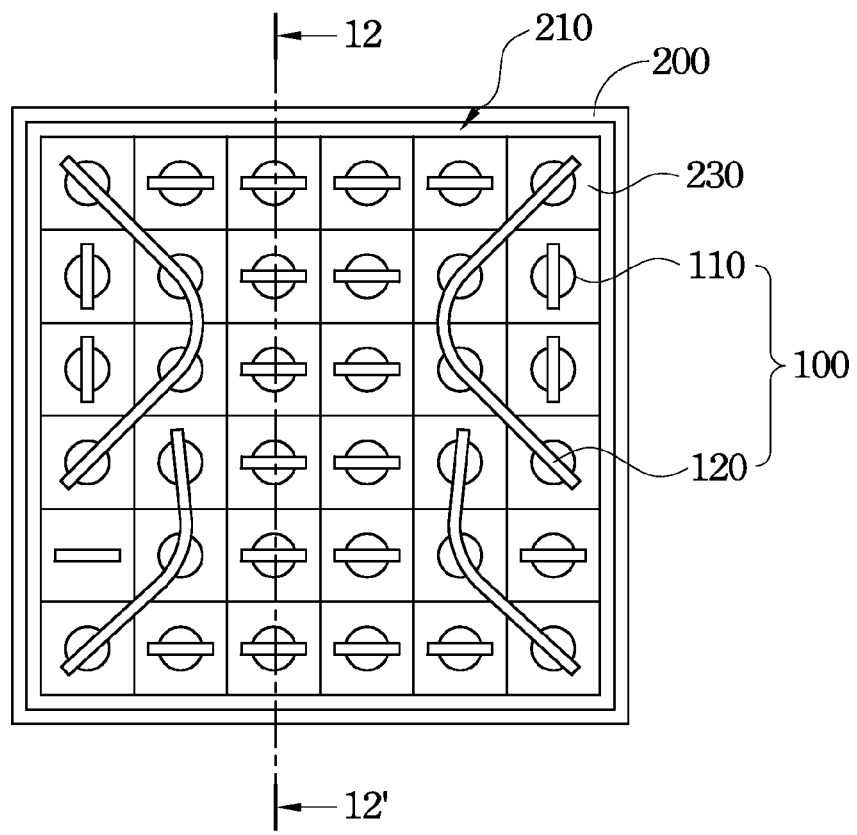
FIG. 13 is a rear view of the heat dissipation structure and the solar module shown in FIG. 1 in accordance with another embodiment of the present invention.
Figure 14:
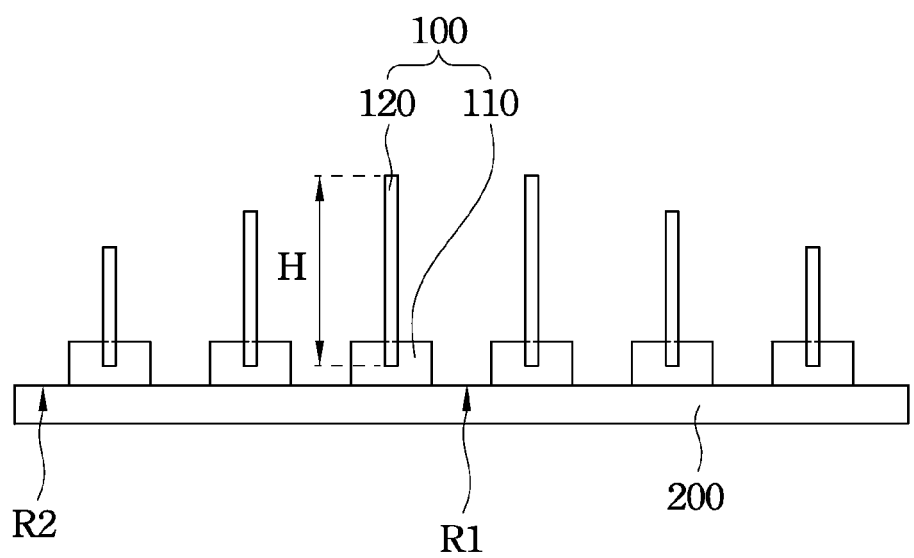
FIG. 14 is a cross sectional view of the heat dissipation structure and the solar module taken along line 12-12' shown in FIG. 13.

FIG. 13 is a rear view of the heat dissipation structure 100 and the solar module 200 shown in FIG. 1 in accordance with another embodiment of the present invention. FIG. 14 is a cross sectional view of the heat dissipation structure 100 and the solar module 200 taken along line 12-12' shown in FIG. 13. As shown in FIG. 13 and FIG. 14, some of the fins 120 connected between the heat conduction bases 110 extend along straight paths, and some of the fins 120 connected between the heat conduction bases 110 extend along curved paths. Each of the fins 120 extending along a straight path is located on one of the heat conduction bases 110, and each of the fins 120 extending along a curved path is located on four of the heat conduction bases 110.

In this embodiment (shown in FIGS. 13 and 14), the heights H of the fins 120 are gradually decreased from the center R1 of the solar module 200 to the edge R2 of the solar module 200. Consequently, an air flow perpendicular to the fins 120 can flow from the fins 120 in the area of the edge R2 to the fins 120 in the area of the center R1, such that the heat dissipation structure 100 has good heat dissipation efficiency.

Figure 15:
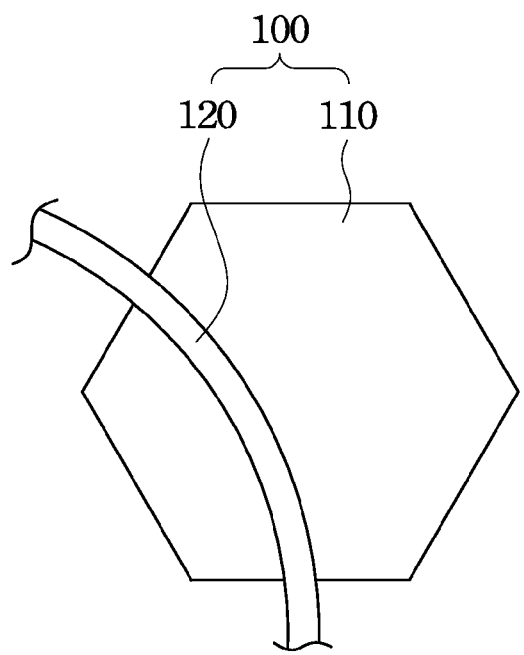
FIG. 15 is a rear view of one of the heat conduction bases and one of the fins according to an embodiment of the present invention.

FIG. 15 is a rear view of one of the heat conduction bases 110 and one of the fins 120 according to an embodiment of the present invention. The heat dissipation structure 100 includes the heat conduction base 110 and the flexible fin 120. In this embodiment, the heat conduction base 110 is a six-sided polygon. However, in other embodiments, the heat conduction base 110 may be round, elliptical, rectangular, or any polygon with N sides, where N is a natural number more than or equal to 3.

Figure 16:
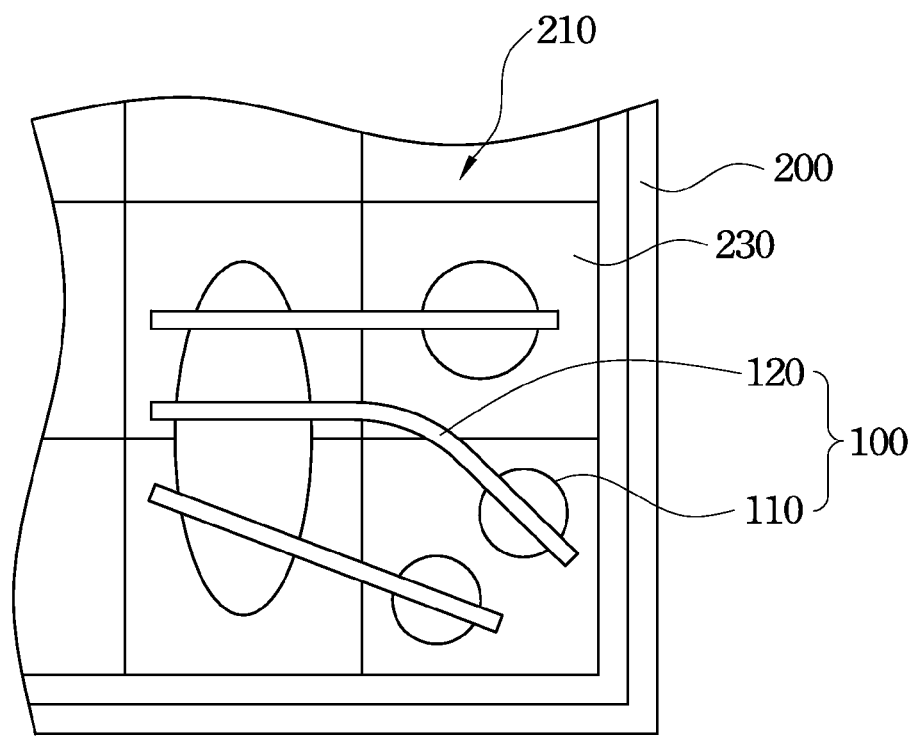
FIG. 16 is a partial rear view of the heat dissipation structure and the solar module shown in FIG. 1 in accordance with another embodiment of the present invention.

FIG. 16 is a partial rear view of the heat dissipation structure 100 and the solar module 200 in accordance with another embodiment of the present invention. In this embodiment, one of the heat conduction bases 110 is located on one of the solar cells 230, two of the heat conduction bases 110 are located on another one of the solar cells 230, and one of the heat conduction bases 110 is located on two of the solar cells 230. The fins 120 still can be connected between the heat conduction bases 110.

Compared with conventional fins, the fins of the heat dissipation structure of the present invention are coupled to the positioning grooves and connected between the heat conduction bases, such that the fins do not contact the solar module. Moreover, the fins are flexible, such that the fins can be adjusted to extend along straight or curved paths in accordance with practical requirements. Each of the heat conduction bases can be located on one of solar cells. When the temperature of the solar cells is increased, the heat transfers to the heat conduction bases first. Thereafter, the heat transfers to the fins from the heat conduction bases. As a result, even though the thermal contraction ratio of the solar cells is different from the thermal contraction ratio of the fins, the solar cells are not damaged by the fins when the fins undergo thermal expansion and contraction. When the solar module is located outdoors, even if the solar module is bent when subjected to a large air flow (e.g., a strong wind), each of the heat conduction bases is located on one of the solar cells and the fins are coupled to the positioning grooves of the heat conduction bases. Through such a configuration, the fins are prevented from separating from the solar module in the event that the solar module undergoes deformation. The solar cells are not damaged easily by the heat dissipation structure due to thermal expansion and contraction, and the heat dissipation structure does not separate from the solar cell easily when the solar module is bent, such that the lifespan and efficiency of the solar module are significantly increased.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A heat dissipation structure for being disposed on a solar module that has a plurality of solar cells, wherein the heat dissipation structure comprises:
    a plurality of heat conduction bases, wherein each heat conduction base is located on each solar cell and each heat conduction base comprising a first surface, and a second surface opposite to the first surface and a height between the first and second surfaces, wherein a positioning groove is formed in the first surface of each of the heat conduction bases with a depth, wherein the depth is shorter than the height; and
    a flexible fin being inserted in the positioning grooves of each heat conduction bases and connected between the heat conduction bases, wherein each of the positioning grooves starts at a first edge of each first surface and terminates at a second edge of each first surface.

2. The heat dissipation structure as claimed in claim 1, wherein the height of the fin is greater than the depth of each of the positioning grooves, such that at least a portion of the fin protrudes from the first surface of each of the heat conduction bases.

3. The heat dissipation structure as claimed in claim 1, wherein the number of the solar cells is the same as the number of the heat conduction bases, and the second surface of each of the heat conduction bases is fixed to each one of the solar cells.

4. The heat dissipation structure as claimed in claim 1, wherein each of the heat conduction bases is cylindrical, and the diameter of each of the heat conduction bases is smaller than or equal to the width of each of the solar cells.

5. The heat dissipation structure as claimed in claim 1, wherein the heat dissipation structure comprises a plurality of the fins, and the heights of the fins are gradually decreased from the center of the solar module to the edge of the solar module.

6. The heat dissipation structure as claimed in claim 1, wherein each of the positioning grooves comprises a groove bottom, and a distance is present between the groove bottom and the second surface of the corresponding heat conduction base, such that a gap between a portion of the fin located between two of the heat conduction bases and the solar module is greater than the distance.

7. The heat dissipation structure as claimed in claim 1, wherein the fin further comprises a plurality of coupling portions, and each of the coupling portions and the positioning grooves has an L-shaped cross section.

8. The heat dissipation structure as claimed in claim 7, wherein a through hole is formed in the first surface of each of the heat conduction bases and communicated with the corresponding positioning groove, and the heat dissipation structure further comprises:
    a plurality of fixing elements respectively coupled to the through holes, wherein the fixing elements respectively abut against the coupling portions, such that each of the coupling portions is securely fixed in one of the positioning grooves.

9. The heat dissipation structure as claimed in claim 1, further comprising:
    an adhesive layer located between the second surface of each of the heat conduction bases and the backlight surface of the solar module.

10. The heat dissipation structure as claimed in claim 9, wherein each of the adhesive layers is a double-sided adhesive layer, or includes a silicon or packaging material.

11. The heat dissipation structure as claimed in claim 1, wherein each of the heat conduction bases is round, elliptical, rectangular, or an N-sided polygon, where N is a natural number more than or equal to 3.

* * * * *